United States Patent [19]

Dill

[11] Patent Number: 5,416,405
[45] Date of Patent: May 16, 1995

[54] TEST PROBE WITH IMPROVED CAPTURE ASSEMBLY AND THREADED NEEDLE POINT PROBE ADJUSTMENT

[76] Inventor: David M. Dill, 1949 Las Tunas Rd., Santa Barbara, Calif. 93103

[21] Appl. No.: 99,728

[22] Filed: Aug. 2, 1993

[51] Int. Cl.⁶ .................................. G01R 31/02
[52] U.S. Cl. ........................... 324/72.5; 324/149
[58] Field of Search ............ 324/72.5, 126, 133, 324/149, 556, 158 P; 340/654

[56] References Cited

U.S. PATENT DOCUMENTS

| | | |
|---|---|---|
| 2,529,270 | 11/1950 | Webster . |
| 2,639,318 | 5/1953 | Des Roches . |
| 2,769,155 | 10/1956 | Wimble ........................... 339/108 |
| 3,201,746 | 8/1965 | Askew . |
| 3,363,171 | 1/1968 | Sietmann ........................ 324/72.5 |
| 3,662,259 | 5/1972 | Dapolito ......................... 324/72.5 |
| 3,864,629 | 2/1975 | Dana ............................... 324/72.5 |
| 3,893,027 | 7/1975 | Veenendaal .................... 324/158 P |
| 3,996,511 | 12/1976 | Baer ................................ 324/556 |
| 4,709,206 | 11/1987 | Edwards et al. ............... 324/158 P |
| 4,716,365 | 12/1987 | Pool ................................ 324/158 P |
| 4,853,625 | 8/1989 | Fodali et al. .................... 324/149 |

FOREIGN PATENT DOCUMENTS

| | | | |
|---|---|---|---|
| 192057 | 1/1986 | European Pat. Off. ......... 324/72.5 |
| 2444940 | 8/1980 | France ............................ 324/72.5 |

*Primary Examiner*—Kenneth A. Wieder
*Assistant Examiner*—Christopher M. Tobin

[57] ABSTRACT

The probe is a tubular shaped device held in one hand such as one would hold a hypodermic syringe. An extended L shaped hook acquires and presses an electrical wire to be tested into the apex of a V notched holding block. The hook and holding block, with test wire in between, are held pressed together by spring action. The holding block has a guide and outlet hole centered at the apex of the V notch which receives and guides a needle probe along a radial line towards the central axis of the wire. The needle pressure and position are controlled independently by the operator via a threading mechanism. Proper penetrating pressure can be applied for a range of wire sizes and insulation types. The needle is removable for sharpening or replacement.

7 Claims, 2 Drawing Sheets

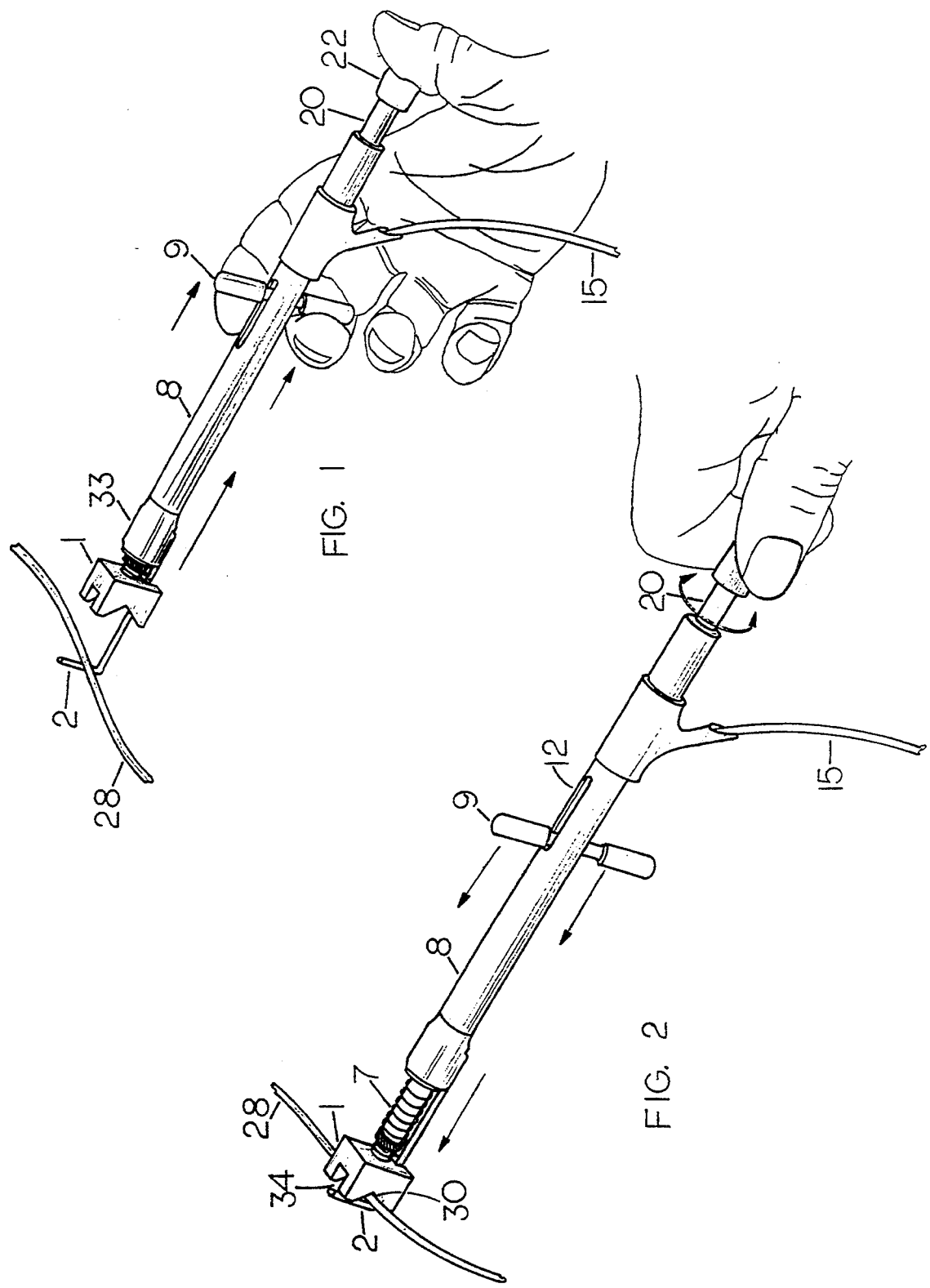

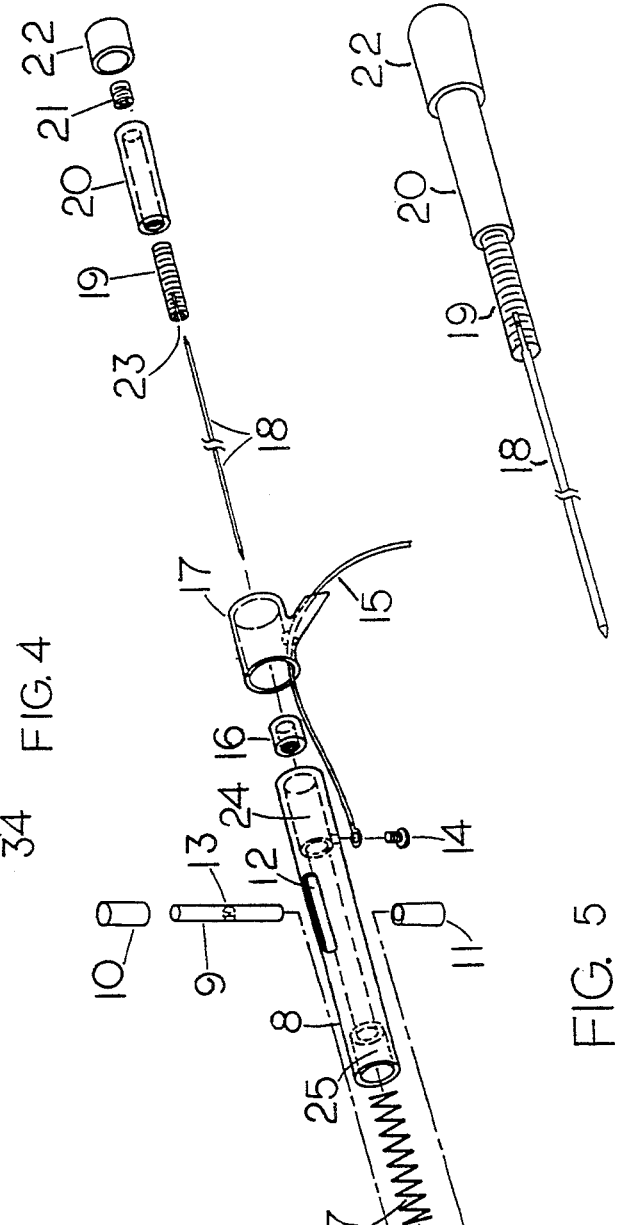
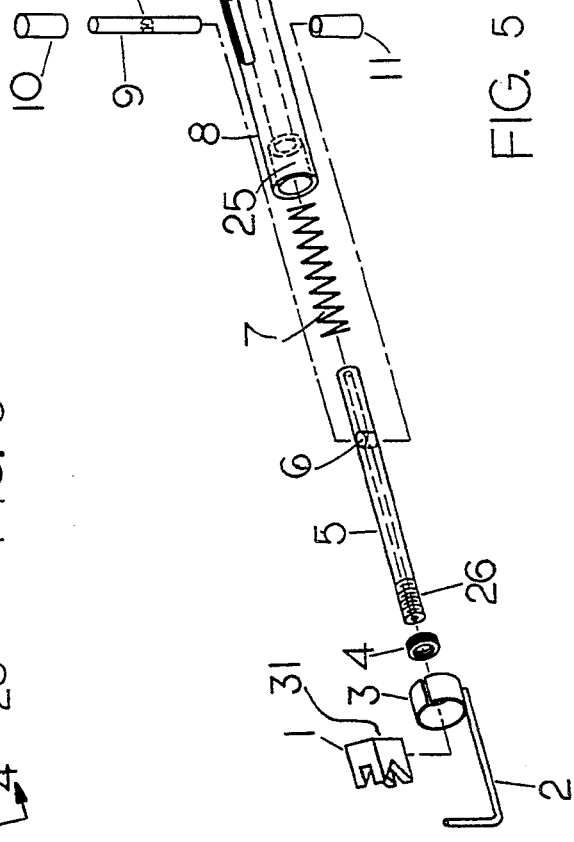
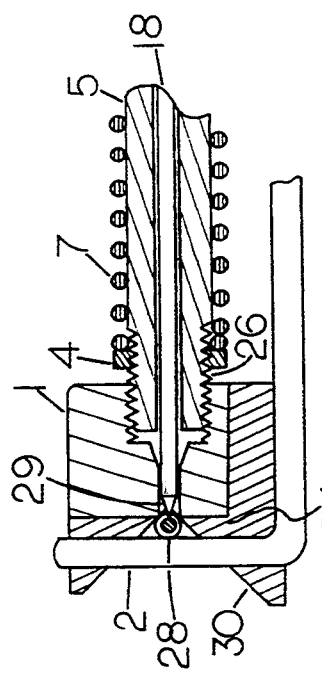
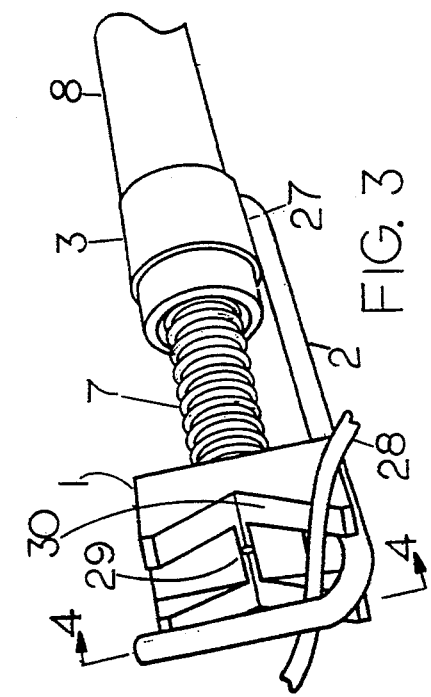

TEST PROBE WITH IMPROVED CAPTURE ASSEMBLY AND THREADED NEEDLE POINT PROBE ADJUSTMENT

FIELD OF THE INVENTION

This invention relates to the field of electrical technology, and particularly to apparatus for testing of voltage levels present in insulated wires.

BRIEF DESCRIPTION OF THE INVENTION

This invention comprises an insulation piercing electrical test probe having a means of acquiring and holding an electrical wire to be tested in a precise orientation such that a conductive needle point probe, when applied to the wire under pressure, will penetrate the insulation of said wire along a radial line to the central axis of said wire. The ability to maintain a precision alignment between a wire and a needle probe is important. In the abscence of proper alignment and rigid restraint a needle probe tends to act as a wedge forcing the wire away from the desired line of intersection. This may result in lack of an electrical connection being made and excessive tearing of the insulation jacket. By employing precision alignment and controlled insulation penetrating depth my test probe produces a hole in the insulation jacket which is generally so small that one must use a magnifying glass to observe it after the probe is removed. Because of this and other factors which shall become apparent this invention can be used to test very small wires such as those used on electronic wire boards as well as the largest power cables found in automotive electrical systems. In many cases a connector will not have to be removed or a compartment barrier opened in order to get to a wire for testing. The time and frustration thus saved well justifies the use of my invention in these and many other wire testing requirements.

BACKGROUND OF PRIOR ART

BRIEF DESCRIPTION OF THE DRAWINGS

FIG. 1 shows the test probe as it is normally held while acquiring a wire to be tested.

FIG. 2 shows the wire to be tested being firmly held in the capture head by the hook and the operator adjusting the position of the needle point probe in or out by threading action.

FIG. 3 is an enlarged view of the front end of the capture head showing how the hook forces the wire to be tested up the ramp formed by the capture head V notch.

FIG. 4 is a sectional view of FIG. 3 showing the test wire being held in the apex of the V notch and the needle point probe being applied to the test wire along a radial line to the central axis of the wire.

FIG. 5 is an exploded view of the entire test probe assembly.

FIG. 6 is an assembled view of the needle holding collet and handle assembly.

Any review of prior art in the general nature of this invention must consider several factors but two stand out right away as to what has been more or less common in the past. Namely the way the wire was hooked and the means of force used to apply the needle probe. In theory they might have looked good but in practice they were not reliable and no significant market has developed for what could otherwise be an absolutely excellent aid in electrical trouble-shooting.

Briefly stated the needle probe and the hooking means seldom "line up" and the spring pressure or squeeze type scources for probe pressure are either too much or too little for a range of wire types and sizes. Accordingly two strong objectives of my invention were to provide a means to fixture the wire and the probe as intimately as possible allowing for a range of wire diameters and to apply the needle probe under more controlled conditions than springs or clips can offer.

DESCRIPTION OF THE DRAWINGS

In the drawings, in which like reference numerals refer to corresponding parts throughout the several figures, FIG. 1 is a view of the test probe being held in the hand much as one would hold a hypodermic syringe. A handle 9 has been pulled rearward against spring pressure causing a capture head 1 to move rearward and expose a hook 2 which may now be used to work its way behind a wire to be captured and tested. During this first stem a needle adjusting handle 20 with its end cam 22 do not move in relation to any back and forth motion of the handle 9 and capture head 1. The needle probe, not shown, remains sheathed.

FIG. 2 shows the handle 9 having been released and the capture head 1 nesting the wire to be tested 28 in the apex of its v notch 30 against the hook and under the forward pressure of a compression spring 7. In the abscence of a wire to be tested the hook 2 would reside within and be surrounded by the transverse slot 34 formed in the face of the capture head 1. At this step the needle probe is threaded forward by rotating the needle adjusting handle 20 clockwise until electrical contact is made. Interconnection with electrical instruments is made via a flexible test lead 15.

FIG. 3 is an enlarged view of the wire to be tested 28 being hooked and forced to slide up the v notch 30 as the capture head 1 is moved forward under the pressure of spring 7.

FIG. 4 is a sectional view of the working end of FIG. 3. This shows the wire to be tested 28 being held in the apex of the v notch 30 of the capture head 1. The spring 7 supplies the retaining force against a knurled ring 4. Capture head 1 is free to rotate axially a slight amount as it is moved back and forth along a guide rail furnished by the horizontal portion of the hook 2. This aids the nesting alignment as the transverse slot attempts to move past and surround the vertical end of the hook 2. The needle probe 18 is shown in its final position of electrical contact with the wire to be tested 28 after having been advanced through the slider tube 5 and guided to the apex of v notch 30 via the precision guide hole 29.

FIG. 5 is an exploded view of the linear arrangement of the components of the invention as outlined in the description of the preferred assembly.

FIG. 6 is a view of the needle point probe assembly whereby the needle probe itself can be exchanged and or reversed.

DESCRIPTION OF THE COMPONENTS AS DESIGNATED BY THE REFERENCE NUMERALS

A capture head formed from a nonconducting material and generally shaped as shown in FIG. 3 and FIG.

4. The apex of the v slot resides slightly below the surface of the vertical slot. This provides a nesting v for the smallest wires of the probes range. A through hole 29 is formed to be a sliding fit for the needle probe 18. The hole is slightly enlarged at the threaded juncture to form a funnel.

A rigid L shaped hook formed from spring tempered wire and electrically insulated with a heat shrink tubing material after it has been brazed or welded to a metallic sleeve 3.

A metallic split ring sleeve sized to be a sliding fit over barrel housing 8 and welded or brazed to hook 2 at juncture 27.

An internally threaded ring which provides a shoulder for spring to bear against.

A slider tube which provides a guide, support and electrical insulator for needle probe 18. The inside diameter is sized for a sliding fit for needle probe 18. The outside diameter is sized for a sliding fit through barrel housing 8. A cross hole 6 is formed through and sized for a sliding fit with pull handle 9. End 26 is threaded to mate with capture head 1.

A compression spring sized for a sliding fit over slider tube 5 and designed to provide residual thrust when the capture head 1 is in its maximum forward position.

A tubular shamed housing formed from a nonconducting material. A pocket 25 is formed in one end to receive spring 7. A through slot 12 is formed to receive handle 9 and another pocket 24 is formed to receive the insert 16 and be a sliding fit for receiving the needle adjusting handle 20.

A pull handle formed from a rigid nonconducting material such as pultruded fiberglass. The handle having a cross hole formed at the center of its length which is sized to mass the needle probe 18.

A molded cam which is a mush fit onto handle 9.

Same as 10.

A screw for attatching the test lead 15 into the insert 16.

A flexible insulated test lead to provide electrical connection between the test probe and external instruments.

An internally threaded metallic insert which is inserted into barrel housing 8 and then drilled and tapped in concert to receive screw 14.

A molded flexible insulating boot formed to be a push fit over barrel housing 8, test lead 15 and screw 14.

A double ended needle probe made from spring tempered stainless steel wire or music wire.

A metal threaded stud. One end having a centered hole formed to receive the needle probe 18 and a formed slot through the central axis. The two halves of the stud separated by the slot being pressed together to form a collet to grip the needle probe.

A nonconducting tube threaded through to receive the stud 19 and set screw 20. The outside diameter being sized for a sliding fit into pocket 24 of barrel housing 8.

A set screw.

A molded mush on end cap

A heat shrink sleeve (see FIG. 1) applied over the split ring 3.

DESCRIPTION OF THE ASSEMBLY

A metal insert 16 is installed into the bottom of pocket 24 in barrel housing 8. As a unit these two components are drilled and tapped to receive screw 14. A ring 4 is threaded onto the end 26 of slider tube 5. Spring 7 is slimmed over the slider tube and against ring 4. The assembly thus formed is inserted into barrel housing 8 and rotated until cross hole 6 is in alignment with slot 12. Pull handle 9 is then inserted completely through slot 12 while passing through cross hole 6. Spring 7 is in a compressed state as it bears against a shoulder formed by pocket 25. Upon release of handle 9 the slider tube assembly will thrust forward out of barrel housing 8 only so far as slot 12 will allow handle 9 to travel.

A hook assembly is formed by brazing or welding an L shaped metal rod 2 to a split ring sleeve 3. The L shaped rod is then electrically insulated using a heat shrink tubing. Ring 3 is slipped onto barrel housing 8 in proper alignment and bonded.

The capture head 1 is brought down into position so that its horizontal slot straddles hook 2. Handle 9 is removed and slider tube 5 is fully threaded into hole 31 in capture head 1. Slider tube 5 is then backed out of hole 31 a minimum of one half turn until cross hole 6 is in alignment with slot 12 of barrel housing 8. Handle 9 is reinstalled through. When handle 9 is released the capture head 1 will travel forward so far as hook 2 will allow.

End cams 10 and 11 are pushed onto handle 9. The test lead 15 is passed through the boot 17. The screw 14 is threaded into the barrel housing 8 and the metal insert 16 while passing through a wrapped end of test lead 15. The boot 17 is pushed over the end of barrel housing 8, test lead 15 and the screw 14 until the head of screw 14 nests itself at the juncture of the boot's Y formation. The length of screw 14 is such that it does not pass into the interior of insert 16.

The needle, collet and handle assembly shown in FIG. 6 is made up by forcing one end of the double ended needle probe into the collet end 23 of stud 19 and then threading handle 20 onto the stud about half way the length of the stud. Set screw 21 is threaded into handle 20 snugly but not tightly against stud 19. Molded end cam 22 is not installed at this stem.

The above assembly is passed into barrel housing 8 such that the needle probe 18 passes through insert 16 into the inside of slider tube 5 and through hole 13 in handle 9, which may need to be rotated for alignment. When stud 19 engages insert 16 it is threaded forward until the shoulder formed by handle 20 abuts against the insert. At this maximum forward position there will be a gap between the needle probe 18 and the hook 2 when handle 9 is slightly retracted in order to observe this condition. The desire is to adjust this gap to a minimum so that the needle probe 18 can come very close to, but does not contact, the hook 2. If the initial gap is about one eighth inch as an example, one would proceed as follows: remove the needle probe assembly completely, loosen set screw 21, thread stud 19 out of handle 20 by some distance less than one eight of an inch and retighten set screw 21 snugly. Reinstall the needle probe assembly as before and check the gap distance. Repeat the calibration until the gap distance is as desired and tighten set screw 21 firmly. Install the molded end cap 22 and the invention is complete.

It should be noted that the invention can be manufactured in different lengths by changing the length of slider tube 5, barrel housing 8 and needle probe 18 in tandem. All other components and dimensions remain the same. A practical range being five to fifteen inches overall length.

The embodiments of the invention in which an exclusive property or right is claimed are defined as follows:

1. A probe for testing an insulated electrical wire, comprising:
   a hollow barrel housing with a front end and a rear end;
   a hook assembly, mounted near the front end of the barrel housing, the hook assembly including a capture hook which extends beyond the front end of the barrel housing;
   a slider tube with a front end, a rear end, an inner diameter and an outer diameter, the slider tube outer diameter proportioned such that the slider tube slidably engages within the barrel housing;
   a capture head, mounted on the front end of the slider tube, the capture head including a V-shaped slot with an apex and a guide slot transverse to the V-shaped slot, the depth of the guide slot being approximately even with the apex of the V-shaped slot, the capture head being in opposition with the capture hook, whereby the capture hook can intersect with the V-shaped slot and the transverse guide slot such that the capture hook can maintain the insulated wire near the juncture of the transverse guide slot and the apex of the V-shaped slot;
   a spring, with a first end attached to the front end of the barrel housing and a second end attached to the front end of the slider tube, whereby the capture head is spring biased towards the capture hook;
   means for pulling the capture head against the spring bias towards the rear end of the barrel housing, whereby the capture hook can be exposed to enable capture of a wire to be tested;
   a needle probe assembly including a front end and a rear end, the front end of the needle probe assembly including a needle probe point, the needle probe assembly extending through the inner diameter of the slider tube and through a hole in the capture head, whereby the needle probe point can move independently with respect to the capture head;
   a first threaded portion attached near the rear end of the barrel housing;
   a second threaded portion attached near the rear end of the needle probe assembly, whereby the needle probe assembly threadedly engages with the barrel housing; and,
   an adjustment handle attached near the rear end of the needle probe assembly, whereby the position of the needle probe point can be adjusted by the threaded engagement of the first and second threaded portions.

2. The probe for testing an insulated electrical wire as claimed in claim 1, further comprising:
   an external test lead attached to the first threaded portion, wherein the first and second threaded portions and the needle probe assembly are electrically conductive.

3. The probe for testing an insulated electrical wire as claimed in claim 1, wherein:
   the hook assembly is integrally formed with the barrel housing.

4. The probe for testing an insulated electrical wire as claimed in claim 1, wherein:
   the first threaded portion comprises a metallic ring with internal and external threads, whereby the external threads can threadedly engage with the rear end of the barrel housing and the internal threads can threadedly engage with the second threaded portion.

5. The probe for testing an insulated electrical wire as claimed in claim 1, wherein:
   the means for pulling the capture head rearward comprises a pull handle which is attached to the slider tube and extends through a pair of slots formed on the barrel housing and wherein the handle includes a cross hole formed through its central portion for passage of the needle probe assembly.

6. The probe for testing an insulated electrical wire as claimed in claim 5, wherein:
   the pull handle is formed from pultruded fiberglass and is capped off on its ends.

7. The probe for testing an insulated electrical wire as claimed in claim 1, wherein:
   the capture hook is L-shaped.

* * * * *